United States Patent [19]

Aikens

[11] Patent Number: 4,553,805
[45] Date of Patent: Nov. 19, 1985

[54] CHIP CARRIER CONNECTOR

[75] Inventor: Paul W. Aikens, Etters, Pa.

[73] Assignee: E. I. Du Pont de Nemours and Company, Wilmington, Del.

[21] Appl. No.: 573,215

[22] Filed: Jan. 23, 1984

[51] Int. Cl.[4] .............................................. H01R 9/09
[52] U.S. Cl. ........................... 339/75 MP; 339/17 CF
[58] Field of Search .......... 339/17 CF, 75 M, 75 MP, 339/176 M, 176 MP

[56] References Cited

U.S. PATENT DOCUMENTS

| | | | |
|---|---|---|---|
| 3,771,109 | 11/1973 | Bruckner et al. | 339/174 |
| 3,910,664 | 10/1975 | Pauza et al. | 339/17 |
| 3,942,854 | 3/1976 | Klein et al. | 339/17 |
| 3,951,495 | 4/1976 | Donaher et al. | 339/17 |
| 3,953,101 | 4/1976 | Palecek | 339/174 |
| 4,023,878 | 5/1977 | Hennessey | 339/17 |
| 4,045,105 | 8/1977 | Lee et al. | 339/17 |
| 4,144,648 | 3/1979 | Grovender | 339/75 |
| 4,189,201 | 2/1980 | Romania | 339/75 |
| 4,204,722 | 5/1980 | Yasui et al. | 339/17 |
| 4,220,383 | 9/1980 | Scheingold et al. | 339/17 |
| 4,278,311 | 7/1981 | Scheingold et al. | 339/17 |
| 4,330,163 | 5/1982 | Aikens et al. | 339/75 MP |
| 4,341,433 | 7/1982 | Cherian et al. | 339/17 CF |
| 4,354,720 | 10/1982 | Bakermans | 339/91 |
| 4,378,139 | 3/1983 | Griffin et al. | 339/17 CF |
| 4,381,131 | 4/1983 | Demnianiuk | 339/17 CF |
| 4,433,886 | 2/1984 | Cassarly et al. | 339/17 CF |

Primary Examiner—John McQuade

[57] ABSTRACT

A semiconductor chip carrier is retained within a connector housing using a pair of compression springs mounted on an exterior surface of the connector housing to move a corresponding pair of latch arms into a locking position over a top surface of the chip carrier.

6 Claims, 7 Drawing Figures

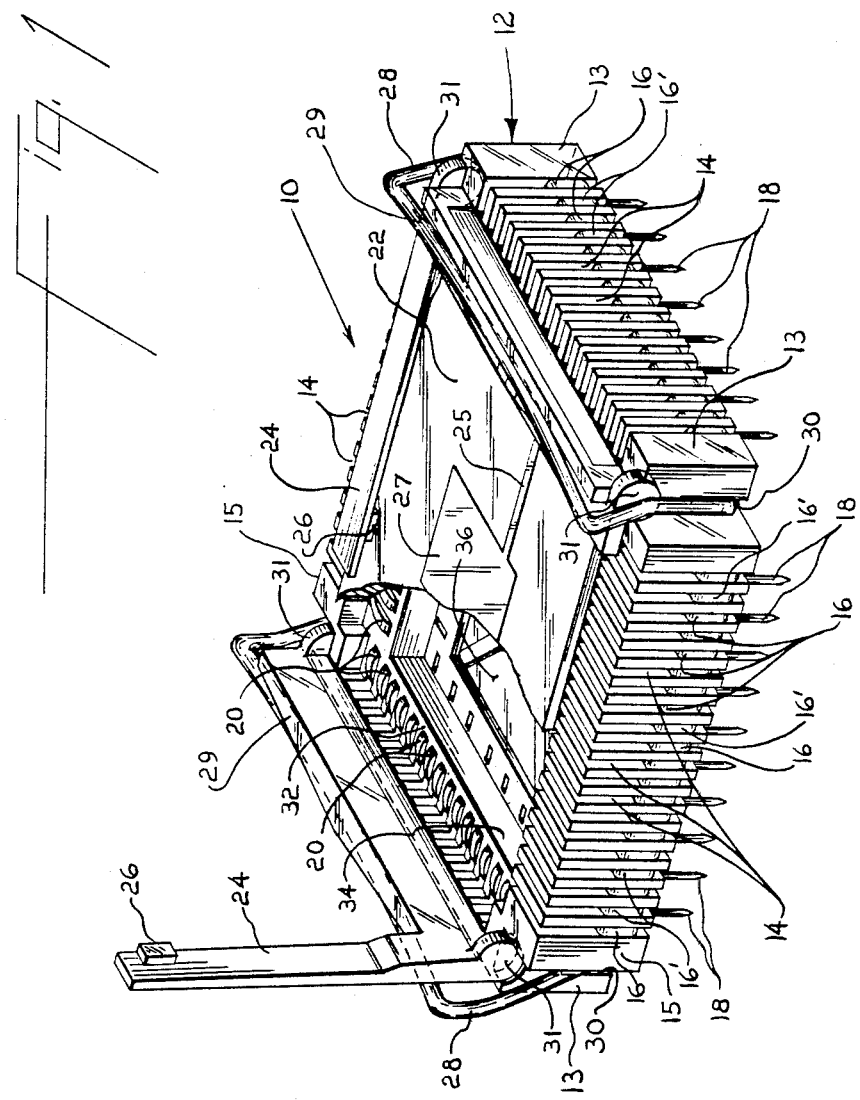

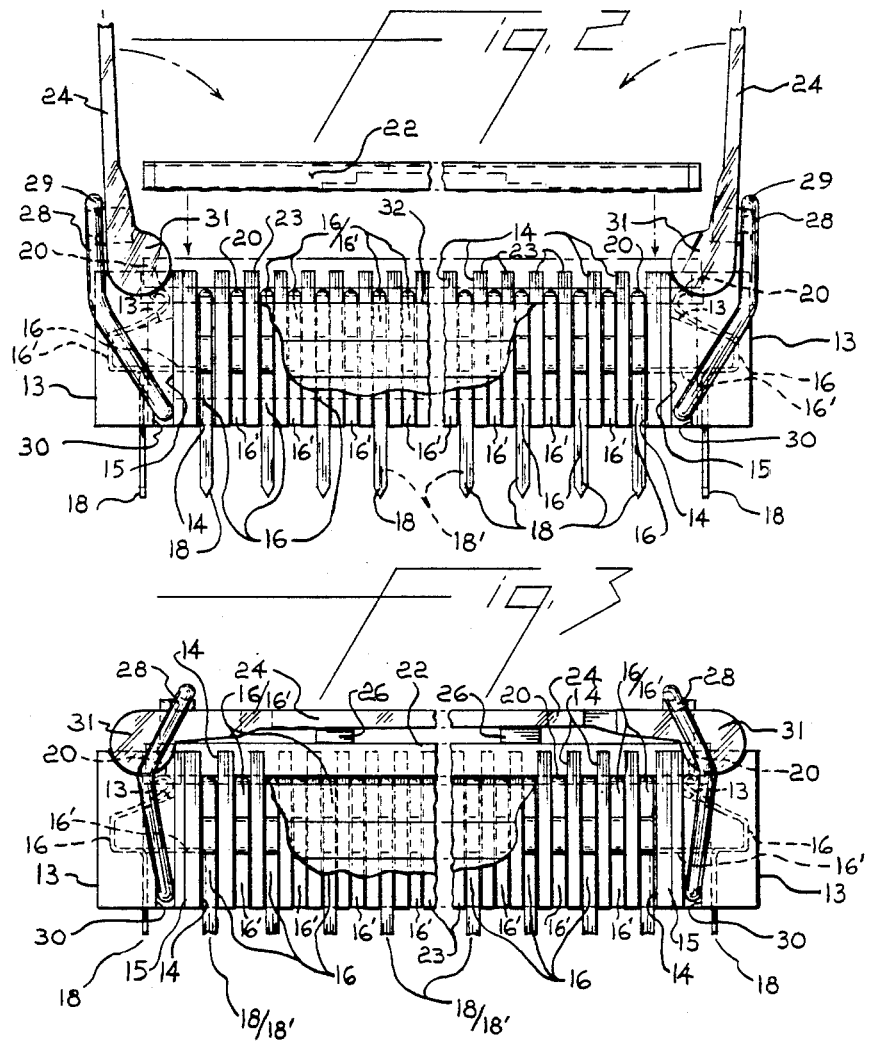

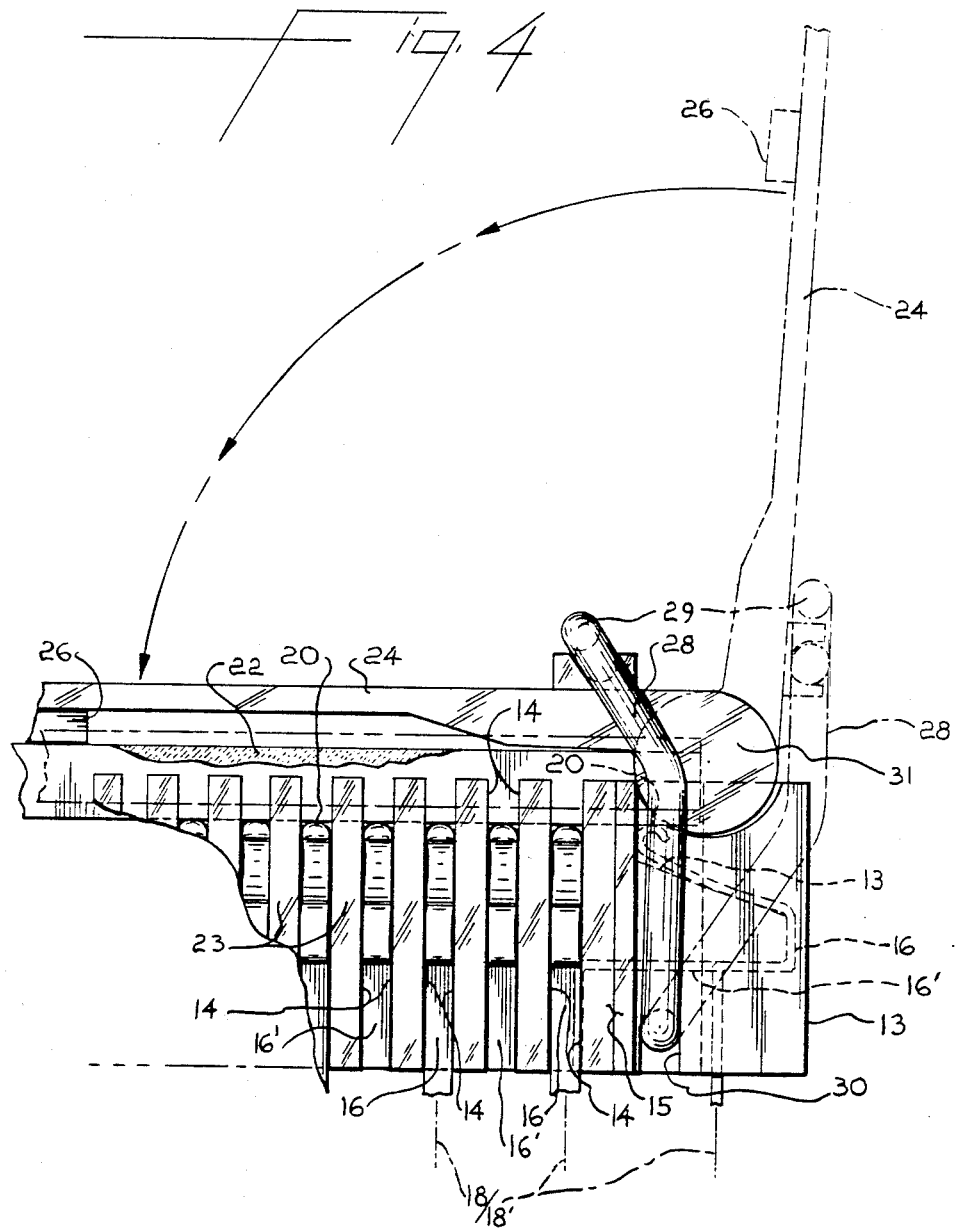

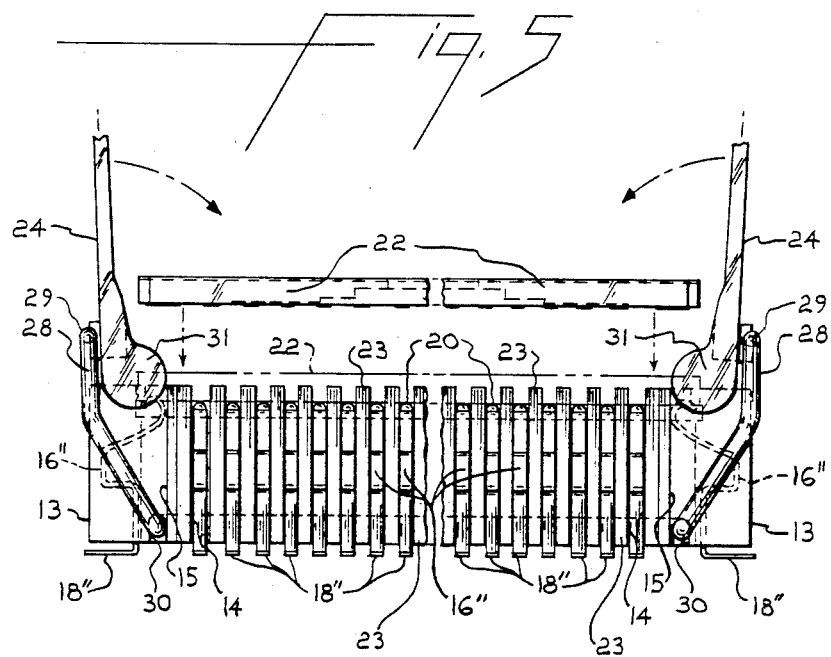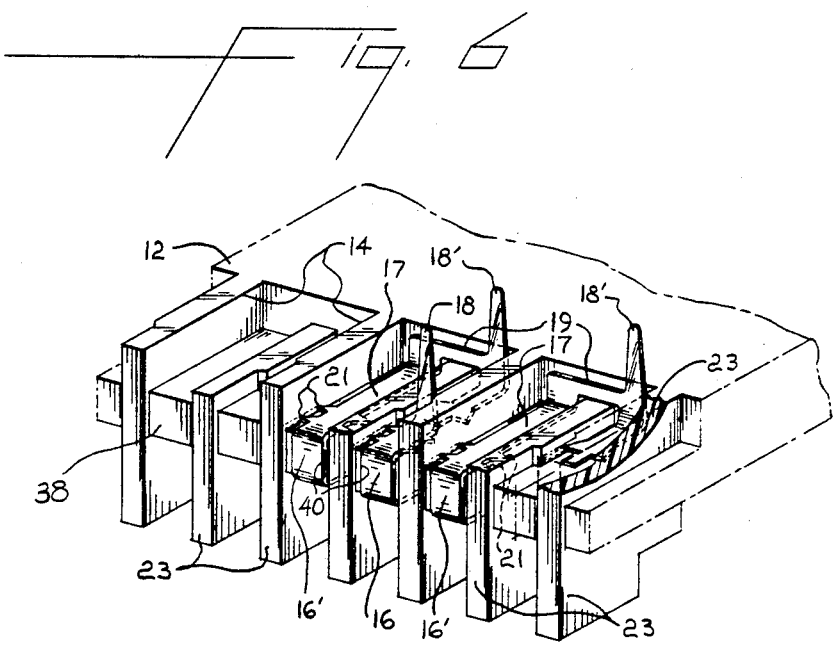

CHIP CARRIER CONNECTOR

BACKGROUND OF THE INVENTION

1. Field of the Invention

This invention relates to a connector for a large scale integrated circuit board and a semiconductor chip. More particularly, it refers to a connector containing a quick release spring for mating contacts on semiconductor chip carriers to corresponding contacts on printed circuit boards.

2. Prior Art

Chip carrier connectors are well known in the prior art as seen from:

| U.S. Pat. Nos. | | |
|---|---|---|
| 3,771,109 | 3,953,101 | 4,204,722 |
| 3,910,664 | 4,023,878 | 4,220,383 |
| 3,942,854 | 4,045,105 | 4,278,311 |
| 3,951,495 | 4,144,648 | 4,354,720 and |
|  | 4,189,201 | 4,378,139 |

Most of these LSI and JEDEC chip carrier connectors have a problem with the mechanism that generates the forces or latches holding the chip carrier in contact with the corresponding connector contacts. They are sometimes too weak to maintain normal force, or they require high forces exerted on the latching system in a manner that can warp or damage the board or chip. Most of the designs have loose pieces floating around when the connector is not loaded. These pieces get lost and are clumsy and difficult to use. Often they require a handtool to apply. A need exists for a more effective chip carrier connector.

SUMMARY OF THE INVENTION

I have designed a novel chip carrier connector having a dielectric frame with four sidewalls and a plurality of vertically extending slots within the sidewalls. The inner surface of the sidewall includes a stepped shelf through which the top surface of a spring contact mounted within the slot protrudes. The bottom portion of the spring protrudes through the bottom of the sidewall for engagement with holes in a circuit board. A pair of compression springs are mounted on opposite sidewalls in a groove on each lower side surface of the sidewall. A pair of opposing symmetrical latches are pivotally mounted in the top portion of the same opposite sidewalls and are spring loaded in both the open and closed position by action of the compression spring. The latch handles have a very high mechanical advantage. The chip carrier with the contacts facing down and the heat sink installed is dropped into a socket formed by the interior surface of the four sidewalls. Light pressure is applied to the top of the carrier as the latches are pushed down to the closed position. To remove the carrier, the latches are simply lifted with a fingernail and the carrier then can be lifted out of the socket.

BRIEF DESCRIPTION OF THE DRAWINGS

The present invention may be best understood by those having ordinary skill in the art by reference to the following detailed description when considered in conjunction with the accompanying drawings in which:

FIG. 1 is a partially cut-away perspective of the connector socket assembly including the chip carrier.

FIG. 2 is an end view of the connector partially in phantom with the latches open.

FIG. 3 is an end view of the connector partially in phantom with the latches closed.

FIG. 4 is a cut-away side view showing a contact spring and position of the compression spring and latch.

FIG. 5 is an alternate connector to the one shown in FIG. 2. L-shaped contact spring ends are substituted for pins.

FIG. 6 is a bottom view of the connector showing contact spring pin ends in two parallel planes.

DESCRIPTION OF THE INVENTION

Figure 7:
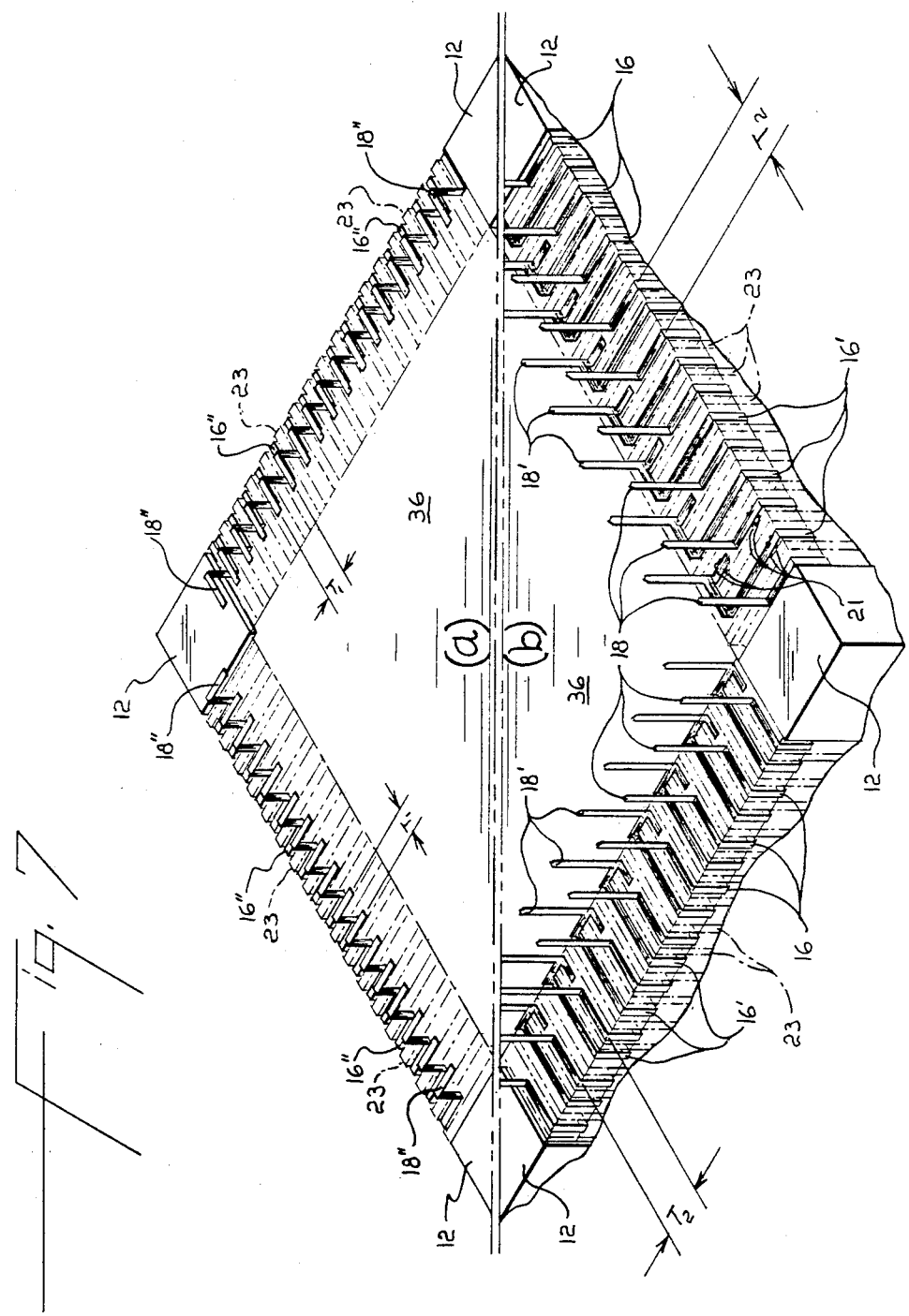
FIG. 7(a) is a bottom view of the connector showing L-shaped contact surfaces for the lower position of the contact spring.
FIG. 7(b) is a bottom view of the connector showing pin ends for the contact springs.

The chip carrier connector 10 comprises a dielectric frame 12 formed from two pair of sidewalls 13 and 15 with a plurality of vertically extending slots 14 molded into each sidewall. The slots 14 are open at the top and partially closed at the bottom of each sidewall with a dielectric anchoring member 38. Each adjacent slot 14 contains a conductive spring member 16 and 16' respectively. These springs 16 and 16' have a lower portion contact pin end 18 and 18' respectively (FIG. 7(b)) protruding from the bottom of slot 14 and an upper contact portion 20.

The inner surface 34 of each sidewall has a stepped shelf 32. A continuation of the inner sidewall 34 below the stepped shelf 32 forms an inner central enclosed socket or cavity 36. A semiconductor chip carrier 22 containing a semiconductor chip 27 and conductive stripes 25 is laid on top of the spring contacts 20 which protrude above the stepped shelf 32 of the sidewalls 13 and 15. Conductor pads (not shown) on the lower surface of the chip carrier contact the spring contacts 20.

Opposing symmetrical latches 24 pivot from the sidewalls 13 at 31. The latches are used to hold the semiconductor chip carrier 22 in place. Latches 24 have a shock absorber 26 on the end of each arm.

Compression springs 28 are each mounted at their lower ends in opposite sidewalls 13 in a spring tension groove 30. The compression spring 28 remains in constant contact with its corresponding latch 24, keeping it under spring tension whether in the closed position FIG. 3 or in the open position FIG. 2. In the closed position, the latch arm is merely lifted up with a fingernail to release the semiconductor chip carrier 22. In the open position, the compression spring upper portion 29 is exterior to the latch and is situated above the sidewall 13.

The contact springs 16 and 16' are located in alternate slots 14. Each slot is separated by a vertical wall 23, and has a lower end anchoring member 38. The lower end of contact springs 16 and 16' has a rigid U-shaped portion 40 anchored to anchoring member 38. Contact spring 16 has a pin 18 at right angles from one beam of the U-shaped portion 40 and projecting from the bottom of slot 14. The lower end of contact spring 16' has an extended arm 17 (FIG. 6) filling the entire bottom of slot 14. A bridging member 19 separates a pin 18' and the extended arm 17.

The bridging member 19 is at 90° angle with respect to the extended arm 17 of spring 16' so that the pin 18' can be aligned with pin 18 on the adjacent spring 16 but in a separate parallel plane. FIGS. 6 and 7(b) depict this configuration which provides for closer spacings in circuit board hole mounting. Barbs 21 provide retention to walls 23.

An alternative contact spring 16" has an L-shaped lower portion 18" to contact circuit board pads. See FIG. 7(a).

The contact spring 16 can be made of any resilient metal suitable for electrical contacts, such as phosphor bronze, cupro nickel and bronze. The contact surface 20 can be coated with a noble metal such as gold or palladium.

The dielectric housing frame 12 can be any of the commonly used dielectric plastics such as polycarbonate or nylon.

The chip carrier connector 10 can vary in dimension depending upon the size of the semiconductor chip carrier 22 mounted within the cavity 36.

Having thus described by invention, what is claimed and desired to be secured by Letters Patent is:

1. In an electrical chip carrier connector for connecting a semiconductor chip to a printed circuit board having a dielectric frame with two pairs of oppositely facing sidewalls, each sidewall having a plurality of vertically extending slots, each sidewall further having a stepped shelf on an interior surface with the remainder of the interior surfaces of the sidewalls together defining a central enclosed cavity, a conductive spring member within each slot having an upper contact portion exposed on the sidewall stepped shelf and a lower portion extending from the bottom of the sidewall, the improvement comprising a pair of compression springs, each having a lower and an upper end, each compression spring mounted at its lower end in a spring tension groove located on a lower side surface of each of the sidewalls of one pair of oppositely facing sidewalls, a pair of latch arms, each latch arm corresponding to one of the compression springs and pivotally mounted on an upper side surface of the same sidewall as its respective compression spring, the latch arms being mounted in diagonally opposed positions, the upper end of each compression spring being positioned above the upper surface of the sidewall and remaining in constant contact under spring tension with its corresponding latch arm so that movement of the compression spring towards the central cavity causes the latch arm to move down and lock over the top surface of the semiconductor chip carrier.

2. A connector according to claim 1 wherein the edges of a semiconductor chip carrier rest on the upper contact portion of the conductive spring members and contact pads on the edges of the lower surface of the chip carrier make electrical contact with the upper contact portion of the conductive spring members.

3. A connector according to claim 1 wherein the lower portion of each conductive spring member is a pin suitable for mounting in a circuit board hole.

4. A connector according to claim 1 wherein the lower portion of each conductive spring member is an L-shaped member for engagement with a circuit board mounting pad.

5. A connector according to claim 3 wherein the pin of adjacent conductive spring members are located in separate parallel planes.

6. In an electrical semiconductor chip carrier connector for electrically connecting a semiconductor chip to a circuit board, said connector having two pairs of opposite sides which surround the interior of the connector and which outer surfaces form the connector exterior, the improvement comprising a pair of compression springs mounted on one pair of said opposite sides of the connector exterior, a corresponding pair of latch arms pivotally mounted on the same connector sides, each compression spring being in constant contact under spring tension with its corresponding latch arm so that movement of each compression spring towards the interior of the connector moves its corresponding latch arm into a locking position over a top surface of the semiconductor chip carrier to retain the semiconductor chip carrier positioned in the connector.

* * * * *